United States Patent
Aggarwal

(10) Patent No.: US 10,833,471 B2
(45) Date of Patent: Nov. 10, 2020

(54) LITHOGRAPHY SYSTEM BANDWIDTH CONTROL

(71) Applicant: Cymer, LLC, San Diego, CA (US)

(72) Inventor: Tanuj Aggarwal, San Jose, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/815,935

(22) Filed: Nov. 17, 2017

(65) Prior Publication Data

US 2019/0155170 A1 May 23, 2019

(51) Int. Cl.
| | |
|---|---|
| *H01S 3/10* | (2006.01) |
| *H01S 3/13* | (2006.01) |
| *G03F 7/20* | (2006.01) |
| *H01S 3/00* | (2006.01) |
| *H01S 3/225* | (2006.01) |
| *H01S 3/134* | (2006.01) |
| *H01S 3/23* | (2006.01) |

(52) U.S. Cl.
CPC ...... *H01S 3/10046* (2013.01); *G03F 7/70025* (2013.01); *G03F 7/70575* (2013.01); *H01S 3/0014* (2013.01); *H01S 3/10069* (2013.01); *H01S 3/134* (2013.01); *H01S 3/1305* (2013.01); *H01S 3/225* (2013.01); *H01S 3/2308* (2013.01)

(58) Field of Classification Search
CPC .. H01S 3/10046; H01S 3/0014; H01S 3/1305; H01S 3/10069; H01S 3/2308; G03F 7/70575
See application file for complete search history.

(56) References Cited

U.S. PATENT DOCUMENTS

| | | | |
|---|---|---|---|
| 2002/0154669 A1* | 10/2002 | Spangler | G03F 7/70025 372/55 |
| 2003/0138019 A1 | 7/2003 | Rylov et al. | |
| 2006/0072636 A1 | 4/2006 | Jaques | |
| 2006/0146900 A1* | 7/2006 | Jacques | H01S 3/1301 372/38.1 |
| 2007/0195836 A1 | 8/2007 | Dunstan et al. | |
| 2008/0253413 A1* | 10/2008 | Partlo | G02B 27/646 372/29.02 |
| 2011/0051760 A1 | 3/2011 | Dunstan et al. | |
| 2015/0138631 A1* | 5/2015 | Russin | H01S 3/10007 359/342 |
| 2016/0380402 A1 | 12/2016 | O'Brien et al. | |
| 2017/0179677 A1 | 6/2017 | Cymer et al. | |
| 2017/0271835 A1 | 9/2017 | Fukui et al. | |

FOREIGN PATENT DOCUMENTS

WO 2016/281488 A1 11/2016

\* cited by examiner

*Primary Examiner* — Yuanda Zhang
(74) *Attorney, Agent, or Firm* — DiBerardino McGovern IP Group LLC

(57) ABSTRACT

Methods and apparatus for controlling laser firing timing and hence bandwidth in a laser capable of operating at any one of multiple repetition rates.

10 Claims, 8 Drawing Sheets

LITHOGRAPHY SYSTEM BANDWIDTH CONTROL

FIELD

The present disclosed subject matter relates to control of laser-generated light sources such as are used for integrated circuit photolithographic manufacturing processes.

BACKGROUND

Laser radiation for semiconductor photolithography is typically supplied as a series of pulses at a specified repetition rate, for example, in the range of about 500 Hz to about 6 kHz. It is useful to provide a user with the option of operating the laser at any one of the number of repetition rates. There are, however, engineering challenges that arise from providing this flexibility. One such challenge arises from the fact that lasers may exhibit a phenomenon known as bandwidth resonance that is a function of the repetition rate (frequency) at which laser is operated. Resonances within chamber may occur at some repetition rates and cause sharp increases in performance metrics, (e.g. bandwidth, pointing and divergence) near the resonant frequencies, with low valleys or floors at frequencies adjacent to the resonance. The presence of resonances per se may be tolerable provided all the data points remain within specification, although additional time and effort may be required during alignment to keep the performance metrics within specification. In addition, peak-to-valley differences in performance metrics caused by resonances may create technical challenges for scanner design and control.

One system for generating laser radiation at frequencies useful for semiconductor photolithography (deep-ultraviolet (DUV) wavelengths) involves use of a Master Oscillator Power Amplifier (MOPA) dual-gas-discharge-chamber configuration. Bandwidth in such a configuration may be managed using a fast bandwidth actuator that controls bandwidth by controlling the relative timing of the pulse (firing) in the master oscillator (MO) portion of the MOPA with respect to the pulse (firing) in the power amplifier (PA) portion of the MOPA. This relative timing is variously referred to as MOPA timing, AtMOPA, or DtMOPA. These shorthand notations are used herein as a shorthand for any differential timing control of the firing of the discharges in a seed laser, such as the MO, and an amplifier laser, such as the PA or PO, or other amplifier laser configuration, and are not limited to a specific configuration such as a MOPA configuration. Such a fast bandwidth actuator is disclosed, for example, in U.S. Pat. No. 7,822,084, issued Oct. 26, 2010 and titled "Method and Apparatus for Stabilizing and Tuning the Bandwidth of Laser Light", the entire specification of which is hereby incorporated by reference. Other examples can be found in U.S. Pat. No. 8,144,739, titled "System Method and Apparatus for Selecting and Controlling Light Source Bandwidth," and issued on Mar. 27, 2012, the entire specification of which is herein incorporated by reference. The fast bandwidth actuator is intended to control for any bandwidth disturbances including those occurring due to bandwidth resonance. However this fast bandwidth actuator is typically implemented as a feedback controller and so responds only after there has been an actual disturbance. Switching from one repetition rate to another, however, may introduce an instantaneous disturbance in the bandwidth which is potentially large enough to drive the bandwidth metrics out of specification. There is thus a need to mitigate the risk of large bandwidth transients due to repetition rate changes.

As noted, it is possible to provide bandwidth control by using MOPA timing as the fast actuator. This actuator has a limited range and so can handle only a limited amount of disturbance in bandwidth. Due to various reasons, including operating repetition rate, the steady state bandwidth may change over time, for example, as a function of the amount of time since a laser chamber was last replenished with gas (refill). This change adds a constant offset in bandwidth which is then compensated by the fast bandwidth actuator. The offset can be large enough that it causes the MOPA timing to saturate at one end of its range leaving little or no room for handling normal variation in bandwidth. This problem is ameliorated by an active spectral control (ASC) desaturation technology that utilizes active bandwidth stabilization (ABS) which slowly introduces bandwidth offset until the MOPA timing actuator is near the center of its active range. Active spectral control is disclosed, for example, in U.S. Pat. No. 8,098,698, issued Jan. 17, 2012 and titled "Active Spectral Control of DUV Laser Light Source", the entire specification of which is hereby incorporated by reference. The solution is also affected when the laser is configured to be able to run at any one of various repetition rates, that is, when the laser is repetition-rate agile. Different repetition rates may exhibit different respective offsets in bandwidth. Centering the MOPA timing for one repetition rate may make other repetition rates off-centered in a way that can result in potentially increased bandwidth errors when switching between extremely different repetition rates.

It is desirable to obviate or mitigate at least one of the problems, whether identified herein or elsewhere, or to provide an alternative to existing apparatus or methods.

SUMMARY

The following presents a simplified summary of one or more embodiments in order to provide a basic understanding of the present invention. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, transients in bandwidth due to changes in repetition rate are reduced or prevented by using a feedforward model of DtMOPA vs. repetition rate where DtMOPA is the steady state value of the fast bandwidth actuator at a certain repetition rate operated for a period of time that is sufficiently long to allow transients to settle down. This feedforward model can be initialized or calibrated by performing a repetition rate scan, and obtaining and storing the settled values for DtMOPA for each repetition rate.

According to another aspect, a calibration is performed after refill in which a repetition rate scan is performed, building a lookup table of MOPA timing vs. repetition rate while bandwidth is locked. The scanned repetition rates are partitioned into bins (e.g., about 10 Hz) and one MOPA timing value is assigned to each repetition rate bin. It is ensured that the MOPA timing value stored in the lookup table is not at the controllable limits to preserve bandwidth control margin. When desaturation is active, the active bandwidth stabilization is controlled in response to a difference between actual MOPA timing at a repetition rate and the value from the lookup table for that repetition rate. If the resonance behavior remains unchanged then desaturation will perform seamlessly across repetition rate transitions. If the resonance behavior changes then the bandwidth offset introduced by the active bandwidth stabilization is adjusted.

According to another aspect, desaturation is performed without any a priori information about repetition rate dependent resonance behavior. Instead, desaturation is performed at least partially on the basis of a user's firing pattern, i.e., pattern of selection of repetition rates which may involve switching across several repetition rates. This will result in MOPA timing jumping among various steady state values, one corresponding to each repetition rate. If one of the repetition rates is such that MOPA timing is close to the limit of its controllable range then active bandwidth stabilization is controlled to offset MOPA timing away from that limit. This reestablishes the margin for the MOPA timing range.

According to another aspect, disclosed is an apparatus comprising a laser configured to operate at any one of a plurality of repetition rates, a bandwidth controller configured to generate a control signal to at least partially control a bandwidth of the laser, a correlator comprising electronically stored feedforward correlation data correlating a value of the control signal to a repetition rate for each of the plurality of repetition rates, and a module configured to determine at least one operating parameter of the laser and for supplying the determined operating parameter to the correlator as a feedforward value, wherein the correlator is configured to generate an adjustment to the control signal based at least in part on the stored feedforward value. The laser may have a first chamber and a second chamber in which case the control signal may be a firing timing control signal DtMOPA that at least partially controls a timing of firing in the second chamber relative to a timing of firing in the first chamber. The correlator may be configured to generate an adjustment to DtMOPA. The adjustment to DtMOPA may be according to the formula DtMOPA+feedforward gain*(FF(RRcurrent)−FF(RRprevious))

where

DtMOPA is the latest actual relative timing of firing in the first and second chamber, FF(RRcurrent) is the stored value of DtMOPA for the current repetition rate, FF(RRprevious) is the stored value of DtMOPA for the previous repetition rate, and feedforward gain is a gain factor.

According to another aspect, the correlator may be a feedforward lookup table storing correlation data correlating a value of the control signal to a repetition rate for each of the plurality of repetition rates. The at least one operating parameter is an average value of DtMOPA for the current repetition rate.

According to another aspect, disclosed is a method comprising the steps of determining a current repetition rate at which a laser is firing, determining if the current repetition rate is substantially the same as an immediately prior repetition rate, and altering an operating parameter of the laser if it is determined that the current repetition rate is not substantially the same as the immediately prior repetition rate. The laser may have a first chamber and a second chamber in which case the operating parameter may be a firing timing control value DtMOPA that at least partially controls a timing of firing in the second chamber in relation to a timing of firing in the first chamber. The method may comprise an additional step of determining an amount of elapsed time between the last time the repetition rate used was substantially the same as the current repetition rate in which case the altering step may comprise altering the operating parameter at least partially on the basis of the step of determining an amount of elapsed time. The step of altering the operating parameter at least partially on the basis of determining an amount of elapsed time comprises altering a feedforward gain.

According to another aspect, disclosed is a method comprising the steps of detecting a change in a repetition rate for a laser capable of operating at any one of a plurality of repetition rates, computing a first operating parameter of the laser since the detected change in repetition rate, and updating, at least partially based on the computed first operating parameter, electronically stored correlation data correlating a value of a second operating parameter to a repetition rate for each of the plurality of repetition rates. The laser may have a first chamber and a second chamber in which case the second operating parameter may be a timing parameter DtMOPA relating to the time of firing in the second chamber in relation to a timing of firing in the first chamber. The electronically stored correlation data may comprise a feedforward lookup table storing correlation data correlating a value of DtMOPA to a repetition rate for each of the plurality of repetition rates. The operating parameter may be an average value of DtMOPA or a bandwidth error. The updating step may be carried out using the relationships FF[rrbin]=FF[rrbin]+gain*(ΔDTMopaavg−ΔFF)

ΔDTMopaavg=DtMOPAavg(current RR)−DtMOPAavg(previous RR))

ΔFF=FF[RR]−FF[RR last]

where

FF[rrbin] is a value stored for relative timing of firing in the bin associated with the repetition rate rr, DtMOPAavg(current RR) is the average timing value for the current repetition rate, DtMOPAavg(previous RR) is the average timing value for an immediately prior repetition rate, FF[RR] is a value stored for relative timing of firing in the bin associated with the repetition rate RR, and FF[RR last] is a value stored for relative timing of firing in the bin associated with an immediately prior repetition rate RRlast.

The above averages may be calculated as moving averages taken over a window of a number of pulses. The number of pulses is preferably small but sufficient to provide a representative average.

According to another aspect, disclosed is a method comprising the steps of detecting a change in a repetition rate from a first repetition rate to a second repetition rate for a laser capable of operating at any one of a plurality of repetition rates, determining when a change in repetition rate is detected whether a control parameter at the second repetition rate is sufficiently different from a saturation value of the control parameter, modifying the control parameter if it is determined that the control parameter at the second repetition rate is not sufficiently different from a saturation value of the control parameter by adjusting an operating parameter to obtain an adjusted operating parameter such that the control parameter is sufficiently different from the saturation value. The laser may have a first chamber and a second chamber in which case the control parameter may be a timing parameter DtMOPA relating to the time of firing in the second chamber in relation to a timing of firing in the first chamber. The operating parameter may be the bandwidth offset introduced by the ABS technology.

According to another aspect, disclosed is a method comprising the steps of detecting a change in a repetition rate from a first repetition rate to a second repetition rate for a laser capable of operating at any one of a plurality of repetition rates and if a change in repetition rate is detected then adjusting an operating parameter such that a control parameter is adjusted to a reference value for the second repetition rate. The laser may have a first chamber and a second chamber in which case the control parameter may be a timing parameter DtMOPA relating to the time of firing in the second chamber in relation to a timing of firing in the first chamber. The operating parameter may be the bandwidth offset introduced by the ABS technology.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
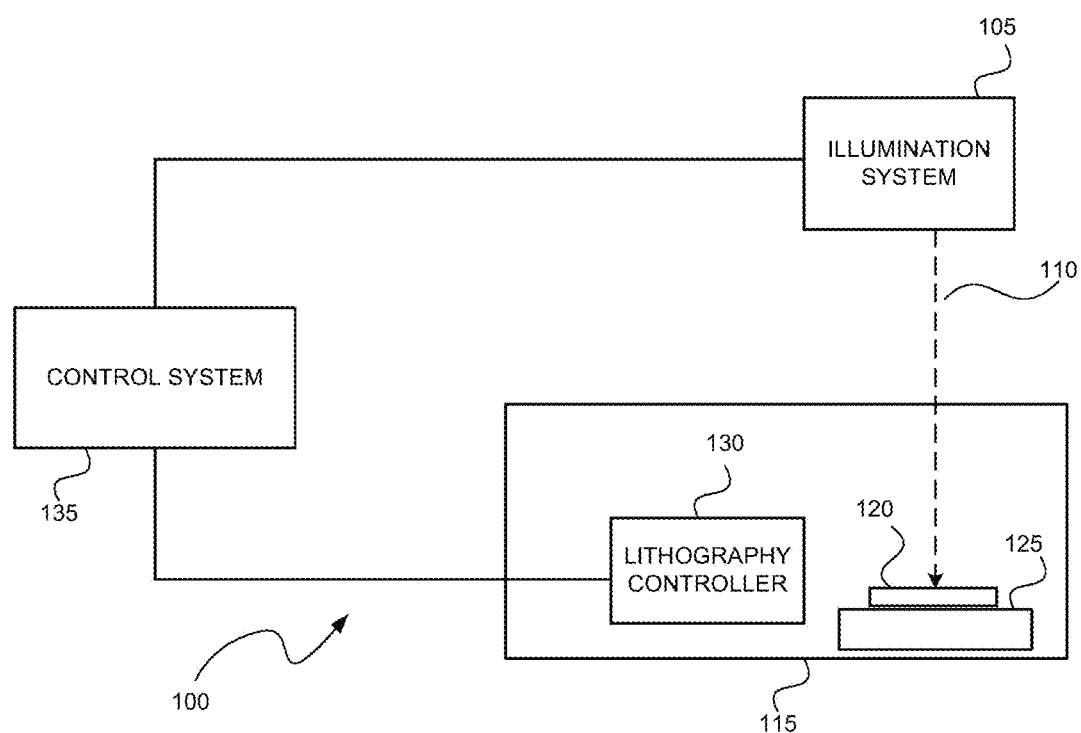
FIG. 1 shows a schematic, not to scale, view of an overall broad conception of a photolithography system according to an aspect of the disclosed subject matter.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, it is instructive to present an example environment in which embodiments of the present invention may be implemented.

Referring to FIG. 1, a photolithography system 100 that includes an illumination system 105. As described more fully below, the illumination system 105 includes a light source that produces a pulsed light beam 110 and directs it to a photolithography exposure apparatus or scanner 115 that patterns microelectronic features on a wafer 120. The wafer 120 is placed on a wafer table 125 constructed to hold wafer 120 and connected to a positioner configured to accurately position the wafer 120 in accordance with certain parameters.

The photolithography system 100 uses a light beam 110 having a wavelength in the deep ultraviolet (DUV) range, for example, with wavelengths of 248 nanometers (nm) or 193 nm. The size of the microelectronic features patterned on the wafer 120 depends on the wavelength of the light beam 110, with a lower wavelength resulting in a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy of the light beam 110 is distributed over different wavelengths. The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120, the mask used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits). The control system 135 can be centralized or be partially or wholly distributed throughout the photolithography system 100.

Figure 2:
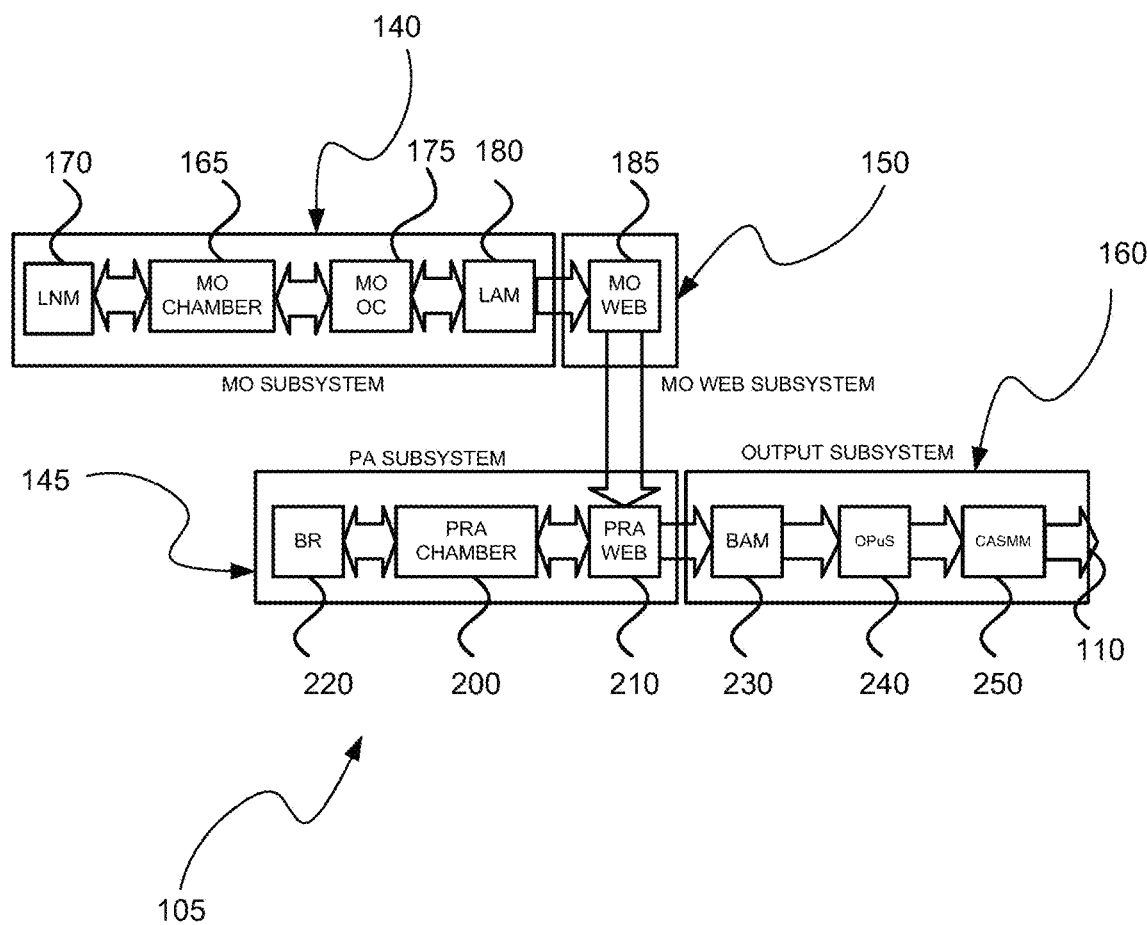
FIG. 2 shows a schematic, not to scale, view of an overall broad conception of an illumination system according to an aspect of the disclosed subject matter.

Referring to FIG. 2, an exemplary illumination system 105 is a pulsed laser source that produces a pulsed laser beam as the light beam 110. FIG. 2 depicts one particular assemblage of components and optical path strictly for purposes of facilitating the description of the broad principles of the invention in general, and it will be apparent to one having ordinary skill in the art that the principles of the invention may be advantageously applied to lasers having other components and configurations.

FIG. 2 shows illustratively and in block diagram a gas discharge laser system according to an embodiment of certain aspects of the disclosed subject matter. The gas discharge laser system may include, e.g., a solid state or gas discharge seed laser system 140, a power amplification ("PA") stage, e.g., a power ring amplifier ("PRA") stage 145, relay optics 150 and laser system output subsystem 160. The seed system 140 may include, e.g., a master oscillator ("MO") chamber 165, in which, e.g., electrical discharges between electrodes (not shown) may cause lasing gas discharges in a lasing gas to create an inverted population of high energy molecules, e.g., including Ar, Kr, or Xe to produce relatively broad band radiation that may be line narrowed to a relatively very narrow bandwidth and center wavelength selected in a line narrowing module ("LNM") 170, as is known in the art.

The seed laser system 140 may also include a master oscillator output coupler ("MO OC") 175, which may comprise a partially reflective mirror, forming with a reflective grating (not shown) in the LNM 170, an oscillator cavity in which the seed laser 140 oscillates to form the seed laser output pulse, i.e., forming a master oscillator ("MO"). The system may also include a line-center analysis module ("LAM") 180. The LAM 180 may include an etalon spectrometer for fine wavelength measurement and a coarser resolution grating spectrometer. A MO wavefront engineering box ("WEB") 185 may serve to redirect the output of the MO seed laser system 140 toward the amplification stage 145, and may include, e.g., beam expansion with, e.g., a multi prism beam expander (not shown) and coherence busting, e.g., in the form of an optical delay path (not shown).

The amplification stage 145 may include, e.g., a lasing chamber 200, which may also be an oscillator, e.g., formed by seed beam injection and output coupling optics (not shown) that may be incorporated into a PRA WEB 210 and may be redirected back through the gain medium in the chamber 200 by a beam reverser 220. The PRA WEB 210 may incorporate a partially reflective input/output coupler (not shown) and a maximally reflective mirror for the nominal operating wavelength (e.g., at around 193 nm for an ArF system) and one or more prisms.

A bandwidth analysis module ("BAM") 230 at the output of the amplification stage 145 may receive the output laser light beam of pulses from the amplification stage and pick off a portion of the light beam for metrology purposes, e.g., to measure the output bandwidth and pulse energy. The laser output light beam of pulses then passes through an optical pulse stretcher ("OPuS") 240 and an output combined autoshutter metrology module ("CASMM") 250, which may also be the location of a pulse energy meter. One purpose of the OPuS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPuS 240 can thus receive the laser beam from the PRA WEB 210 via the BAM 230 and direct the output of the OPuS 240 to the CASMM 250.

One way that bandwidth is controlled in a system such as that just described is by controlling the relative firing time, DtMOPA, of the two laser chambers, i.e., the seed stage master oscillator MO chamber with respect to the power amplifier PA chamber. This is shown schematically in FIG.

3. A controller 300 specifies a value of DtMOPA to be used by a laser 310. In the system shown, the signal from the controller 300 is adjusted at a summing junction 320 by a value ΔDTM from a feedforward table 330. ΔDTM represents the change in DtMOPA value stored in the feedforward table for (1) the then current repetition rate and (2) the repetition rate prior to the current repetition rate. In a pure feedforward model, the value DtMOPA would be based on an a priori understanding of the resonance behavior of the laser 310. During regular laser operation, the repetition rate can be identified on the second pulse of a burst. If the repetition rate has changed from the immediately previous burst then the feedforward model is used to compute the difference between DtMOPA for the new repetition rate and DtMOPA for the previous repetition rate. This difference is then applied to the current value of DtMOPA. The result will be an instantaneous change in DtMOPA that will help prevent large transients in bandwidth. An example of part of a structure for a feedforward table may be as follows:

| Bin number (n) | Repetition rate (rr) (kHz) | DtMOPA |
|---|---|---|
| 1 | 3.990 | $DtMOPA_1$ |
| 2 | 4.000 | $DtMOPA_2$ |
| 3 | 4.010 | $DtMOPA_3$ |
| 4 | 4.020 | $DtMOPA_4$ |

The effectiveness of feedforward control depends to the extent to which the feedforward model is a good representation of the inherent resonance behavior of the laser. As a practical matter, the inherent resonance behavior may change, and it is possible that a feedforward model will be based on an assumed inherent resonance behavior that is no longer valid. This can produce spurious effects and potentially make the transients worse. To mitigate this risk, according to an embodiment there is provided a method to learn new resonance behavior. This method involves feeding back average DtMOPA after feedforward has been applied. The adaptive mechanism can use this average DtMOPA to update the feedforward table to reduce the magnitude of transient errors the next time the same repetition rate is visited from a different one.

According to another embodiment, a feedforward gain is used that controls how much of the previously learned resonance behavior is used for feedforward. As an example, the feedforward gain can be a multiplier with a value between 0 and 1, with 0 meaning no feedforward is used. This feedforward gain can depend, for example, on the amount of time that has elapsed since a most recent previous use of (visit to) the same repetition rate. A feedforward adaptation that has been used recently may be assumed to still be valid, so it may be assigned a higher gain. Conversely a feedforward adaptation that has not been used recently may be less likely to still be valid, so it may be assigned a lower gain. In other words, the feedforward gain may decrease monotonically as the duration of a time interval between visitation to the same repetition rate increases. Conversely, the feedforward gain may increase monotonically as a duration of a time interval between visitation to the same repetition rate decreases. The feedforward gain may be some other function of time, such a step function having a value of one for time intervals below a predetermined threshold and zero for all longer time intervals.

Figure 3:
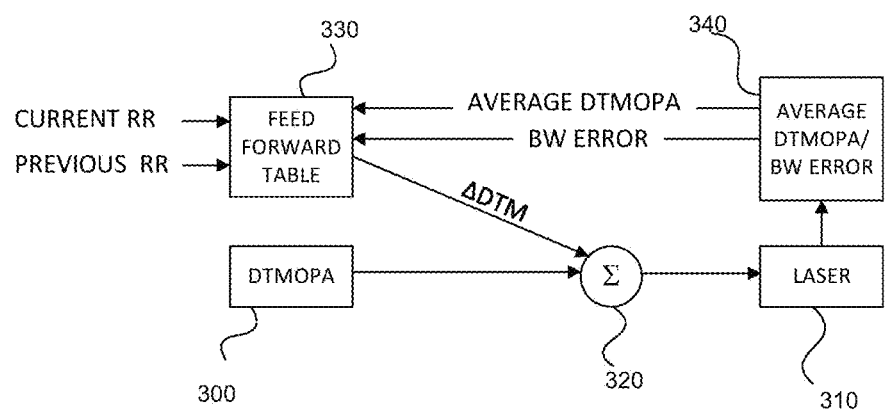
FIG. 3 shows a schematic, not to scale, view of an overall broad conception of system for controlling DtMOPA as a function of repetition rate and bandwidth error.
Figure 4A:
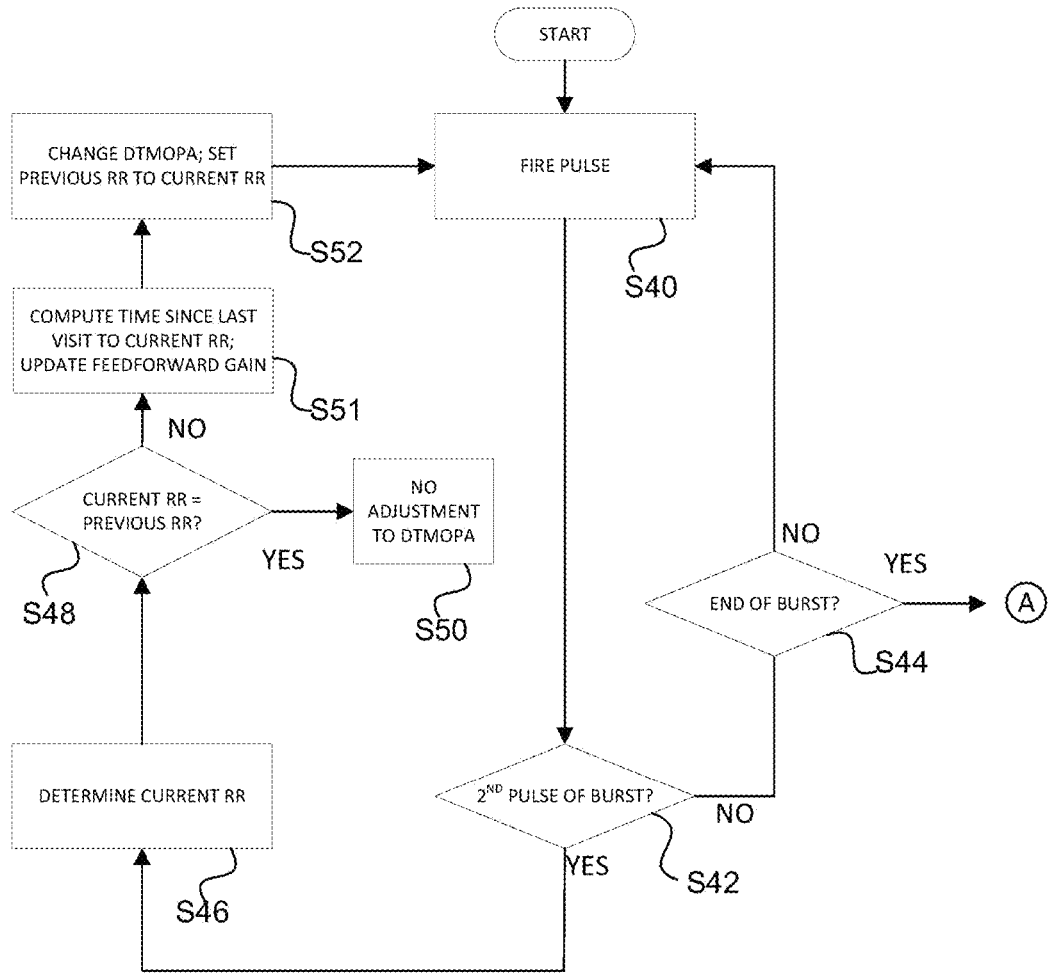
FIGS. 4A and 4B are flowcharts depicting a method of controlling DtMOPA as a function of repetition rate according to an aspect of the disclosed subject matter.
Figure 4B:
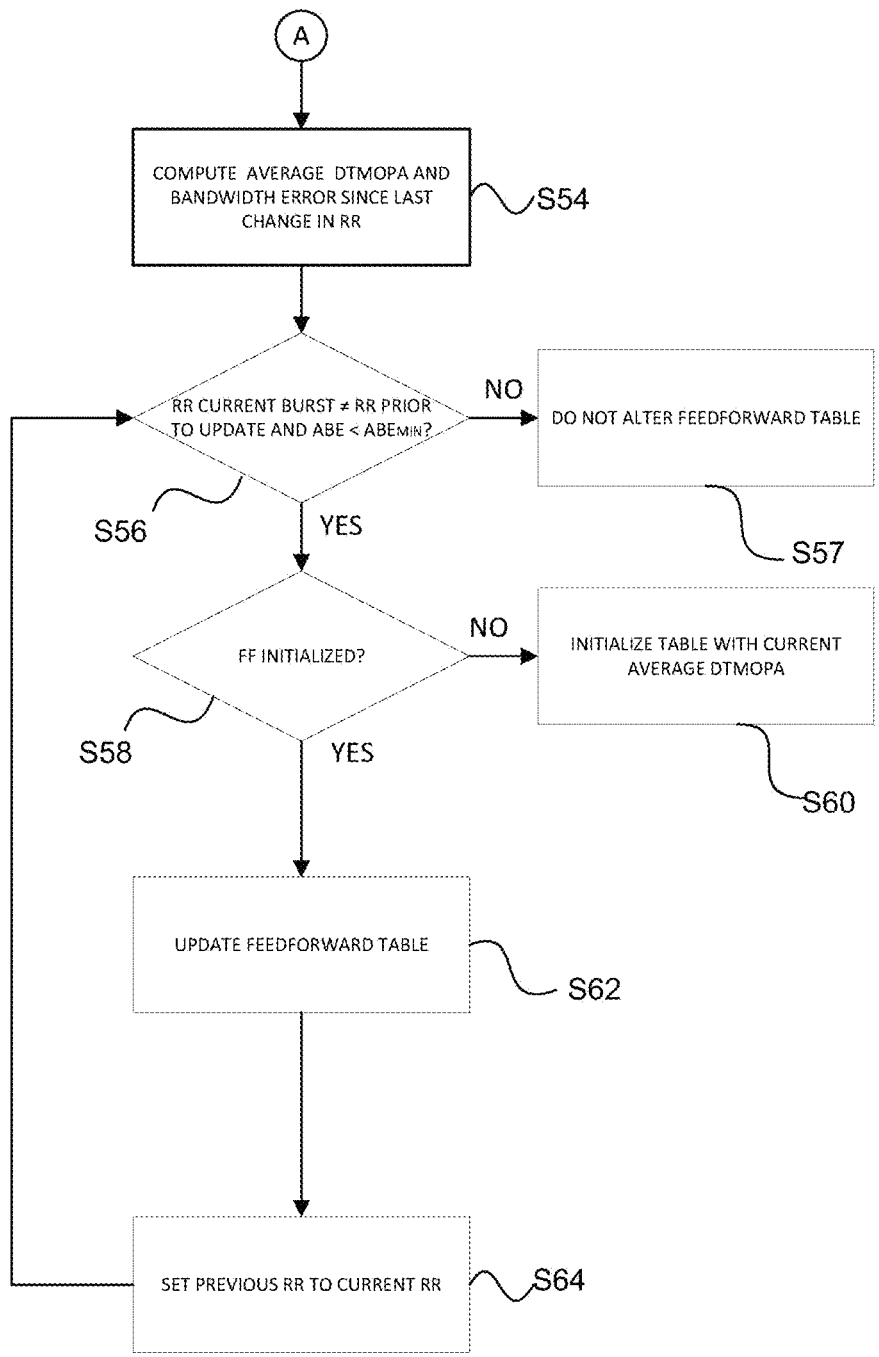

In the arrangement of FIG. 3, a feedforward adaptation module 340 computes an average DtMOPA and supplies signals indicative of the magnitude of average DTMOPA to a feedforward table 330 as a value to be used for feedforward adaptation. These averages may be moving averages over a window of a small number of values. The feedforward table uses the signals to adjust the value of DtMOPA associated with repetition rate and the value of ΔDTM supplied to the summing junction 320. As shown, the feedforward adaptation module 340 may also be configured to detect a bandwidth error for the laser 310. Because of the provision for feedforward it can be assumed that in most instances the bandwidth error will be relatively small and within an acceptable range. Bandwidth error may be detected, however, and used for additional feedforward adaptation. This method involves feeding back the residual error in bandwidth after feedforward has been applied. If the feedforward is inaccurate, there will be a measurable residual error in the bandwidth transient magnitude. The adaptive mechanism can use this error to update the feedforward table to reduce the magnitude of transient errors the next time the same repetition rate is visited from a different one An example of a process to be implemented in an arrangement such as that shown in FIG. 3 is shown in FIGS. 4A and 4B. In a step S40 the laser is caused to fire one pulse. In a step S42 it is determined whether the pulse fired was the second pulse of a burst. Because determining a repetition rate requires at least two pulses, if the determination in step S42 is negative then the process proceeds to step S44 to determine if the then current burst of pulses has ended. If the determination in step S44 is negative then the process reverts to step S40 and the laser fires again. If the determination in step S44 is positive, then the process proceeds to an adaptation procedure as described in connection with FIG. 4B. If the determination in step S44 is if negative, then the process proceeds to step S46 in which the current repetition rate is determined.

In a step S48 it is then determined whether the repetition rate has changed. If it is determined in step S48 that the current repetition rate has not changed, then the process proceeds to step S50, and no adjustment is made to MOPA timing based on the process, although should be understood that changes can be made to MOPA timing by other procedures.

If it is determined in step S48 that the repetition rate has changed, then in step S51 a feedforward gain is computed. The feedforward gain in this example depends on the time elapsed since the same repetition rate was visited as the current repetition rate. In one embodiment the dependency of feedforward gain on elapsed time since last visit to the same repetition rate may be linear such that as more time elapses between successive visitations to the same repetition rate, the feedforward gain decreases and vice-versa. After computing the feedforward gain, in step S52 DtMOPA is adjusted for the now current repetition rate and the current repetition rate is set to be the previous repetition rate, i.e., the new and now current repetition rate is set to be used as the previous repetition rate for the next iteration of the procedure. One example of an adjustment to DtMOPA can be according to the following relationship:

$$DtMOPA = DtMOPA + \text{feedforward gain} * (FF(RR_{current}) - FF(RR_{previous}))$$

In words, the value of DtMOPA to be applied is equal to the most recent value of DtMOPA actually being used plus an adjustment based on a difference between DtMOPA from the feedforward table for the current repetition rate $RR_{current}$ and the value of DtMOPA from the feedforward table for the previous repetition rate $RR_{previous}$, the difference being multiplied by a feedforward gain factor.

FIG. 4B shows a process that may be used to update the feedforward table after the conclusion of a burst. In a step S54 the moving average of MOPA timing and the moving average of bandwidth error (ABE) since last repetition rate change are computed. The average is preferably not computed over all the pulses since the last change in repetition rate. The average is instead preferably computed over a window of recent pulses since the last change in repetition rate. In a step S56 it is determined whether the repetition rate for the burst is different from the repetition rate prior to the last update of the feedforward table, and it is also determined whether the moving average bandwidth error was below a predetermined threshold ($ABE_{MIN}$). If it is determined that the repetition rate has not changed, or that the average bandwidth error has exceeded the threshold, then the feedforward table is not altered in step S57. If, on the other hand, it is determined in step S56 at the repetition rate has changed, and that the average bandwidth error is less than the predetermined threshold, then the process progresses to a step S58 in which it is determined whether the feedforward table for the current repetition rate has been initialized. If it is determined in step S58 that the feedforward table for the current repetition rate has not been initialized, then in a step S60 the feedforward table for the current repetition rate is initialized with the current average DtMOPA for the then current repetition rate. If it is determined in step S58 that if the feedforward table has been initialized, then the feedforward table for the then current repetition rate is updated in a step S62. One method for updating the feedforward table may be according to the following relationship:

$$FF[rrbin]=FF[rrbin]+gain*(\Delta DTMopa_{avg}-\Delta FF)$$

where $$\Delta DTMopa_{avg}=DtMOPA_{avg}(\text{current RR})-DtMOPA_{avg}(\text{previous RR}))$$

$$\Delta FF=FF[RR]-FF[RR\text{ last}]$$

In words, the value for the "bin" (e.g., 10 Hz bin) for the repetition rate stored in the feedforward table may be set equal to previous bin value for that repetition rate plus the product of (1) the gain factor and (2) a difference in average DtMOPA for current repetition rate and the previous repetition rate less the difference of the FF[RR] and FF[RR last], i.e., the DtMOPA values stored in the feedforward table for the current and immediately previous repetition rates.

Then, in a step S64 the current repetition rate is set to be used as the previous repetition rate for the next iteration of the procedure and the process reverts to step S56.

The difference between average MOPA timing before and after the repetition rate change is used because actual MOPA timing responds to normal drift as well as resonance.

As regarding the feedback signal for adaptation and conditions for adaptation, after a change in repetition rate, if the feedforward is not accurate there is a residual bandwidth error. It is expected that the residual error will be compensated by normal operation of the ASC. When normal operation of the ASC is effective at compensation the bandwidth error reduces to within the desired threshold ($ABE_{min}$). Then the converged DtMOPA value may be considered to be desired target for feedforward. Therefore the average DtMOPA after transient convergence can be considered as a signal for adaptation. It is also possible to use bandwidth error as a signal, either independently of or combined with DtMOPA.

To recapitulate, according to at least one embodiment, a lookup table of MOPA timing vs. repetition rate is created. The feedforward lookup table supplies a MOPA timing feedforward adjustment on a repetition rate change. The feedforward mechanism may be configured so that it that works in presence of drift in DtMOPA. The feedforward lookup table may be adapted in an automated and online fashion.

The feedforward model can also be used for repetition-rate dependent MOPA timing desaturation where the bandwidth offset can be adjusted using the active bandwidth stabilization technology such that steady state MOPA timing stays close to the feedforward value. This helps prevent the desaturation logic from saturating at other repetition rates while desaturating at one repetition rate.

To make this procedure compatible with adaptive feedforward, desaturation could be carried out on the feedforward signal rather than the actual DtMOPA. Adaptive feedforward changes the reference DTMOPA for each repetition rate. If there is a uniform drift in bandwidth across all the repetition rates then the adaptive feedforward will react to the drift and effectively change the reference DTMOPA. This will be more severe if drift is faster than the desaturation rate. In such a scenario, it is desirable to prevent the reference DTMOPA from achieving extreme values so it therefore may be desirable to provide another desaturation loop on the reference DTMOPA to keep it within controllable range while the normal desaturation loop is already active and trying to bring current DTMOPA to reference DTMOPA. The new desaturation loop on reference DTMOPA may be configured to override the regular desaturation whenever reference DTMOPA is deemed to be too close to the extreme values.

One form of adaptation maybe repetition rate dependent where the desaturation target is a MOPA timing value that is different for each repetition rate. Another form of adaptation may be a repetition-rate independent ASC desaturation technology where instead of there being a desaturation target the bandwidth offset is adjusted using the automatic bandwidth stabilization technology in response to MOPA timing approaching its limits.

Figure 5A:
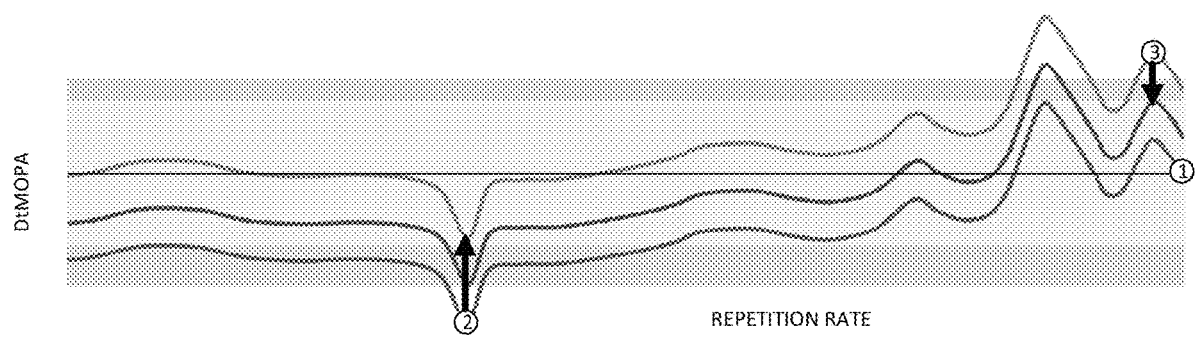
FIG. 5A is a graphical representation of an overall broad conception of a method of controlling a range of adjustment of DtMOPA according to an aspect of the disclosed subject matter and FIG. 5B is a flowchart depicting a method of controlling DtMOPA as a function of repetition rate according to an aspect of the disclosed subject matter.

These processes will now be explained in connection with FIGS. 5A and 5B and FIGS. 6A and 6B. Referring first to FIG. 5A, a curve showing the dependence of DtMOPA on repetition rate are shown. In the background, the vertically middle, lightly shaded region is the range in which DtMOPA is most easily controllable. The upper and lower more darkly shaded regions are areas of marginal DtMOPA controllability, i.e., approaching saturation. If the user is operating at the repetition rate designated by "1", then DtMOPA is comfortably within its controllable zone. If the user switches to repetition rate 2, however, then DtMOPA will be outside of its controllable zone (saturated). In this case, the active bandwidth stabilization adds an offset that moves the controllable zone so that DtMOPA v. repetition rate curve is again within the controllable zone as represented by the topmost curve. If the user then switches to then switches to repetition rate 3 then DtMOPA at this repetition rate is above the upper margin and the active bandwidth stabilization adds an offset that moves the controllable zone until DtMOPA at this repetition rate is within the lightly shaded region. This results in a relationship as shown in the middle curve with respect to the background. This process continues for each repetition rate at which user operates the laser. If the controllable range is sufficient then ultimately, DtMOPA for all the visited repetition rates will be centered within the most controllable lightly shaded region.

Figure 5B:
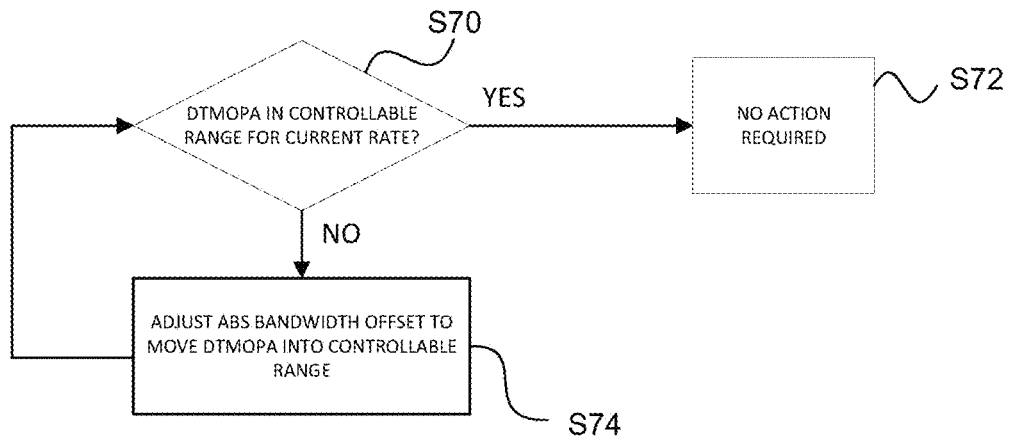

FIG. 5B is a flowchart illustrating the steps of a possible implementation of this process. In step S70 it is determined whether DtMOPA is in its controllable range for the current repetition rate. If DtMOPA is in its controllable range for the current repetition rate then the process requires no further action (step S72). If DtMOPA is not in its in its controllable range for the current repetition rate then in step S74 the ABS bandwidth offset is adjusted to move DtMOPA back into the controllable range in step S74.

Figure 6B:
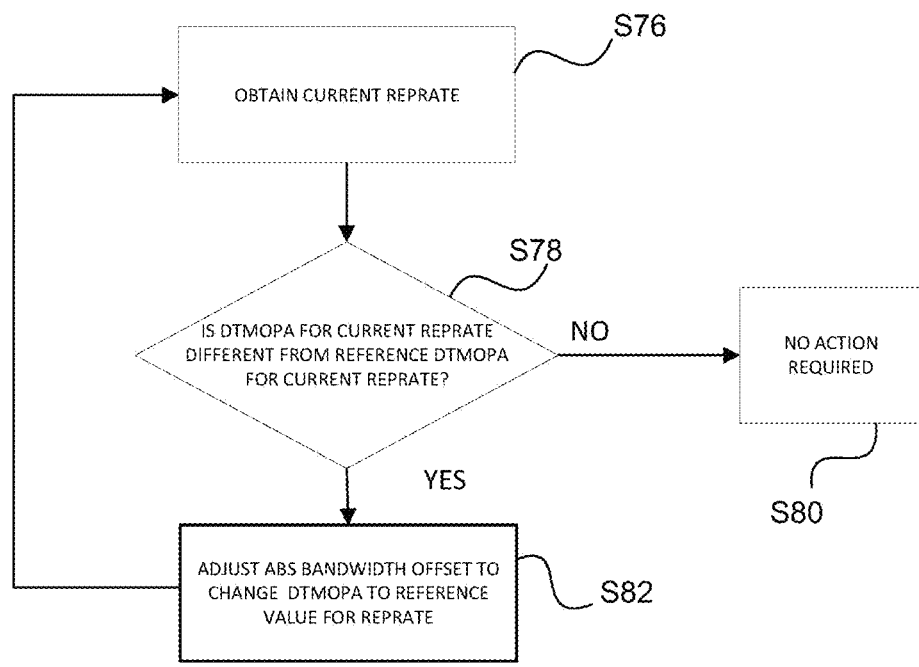
FIG. 6A is a graphical representation of an overall broad conception of a method of controlling a range of adjustment of DtMOPA according to another aspect of the disclosed subject matter and FIG. 6B is a flowchart depicting a method of controlling DtMOPA as a function of repetition rate according to an aspect of the disclosed subject matter.
Figure 6A:
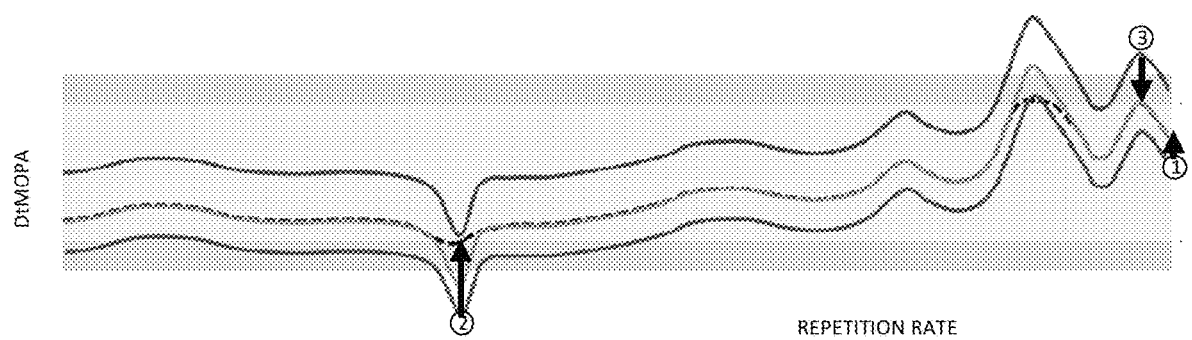

As an alternative, and referring first to FIG. 6A, a curve showing the dependence of DtMOPA on repetition rate is shown. In the background, the vertically middle, lightly shaded region is the range in which DtMOPA is most easily controllable. The upper and lower more darkly shaded regions are areas of marginal DtMOPA controllability, i.e., approaching saturation. In this method there is a DtMOPA reference value for each repetition rate, as shown by the dashed line. If the user is operating at the repetition rate designated by "1", then DtMOPA is adjusted to match the reference value at that repetition rate. If the user switches to repetition rate 2, then DtMOPA is again adjusted to match the reference value at that repetition rate. If the user then switches to then switches to repetition rate 3 then DtMOPA then DtMOPA is again adjusted to match the reference value at that repetition rate. This process continues for each repetition rate at which user operates the laser. If controllable range is sufficient and the bandwidth resonance behavior with respect to repetition rate does not change in shape then ultimately, DtMOPA for all the visited repetition rates will match the reference DtMOPA.

FIG. 6B is a flowchart illustrating the steps of a possible implementation of this process. In step S76 a current repetition rate is obtained. In step S78 it is determined whether the actual DtMOPA for that repetition rate is different from the reference DtMOPA for that repetition rate. If the actual DtMOPA for that repetition rate is the same as the reference DtMOPA for that repetition rate then process requires no further action (step S80). If. If the actual DtMOPA for that repetition rate is the different from the reference DtMOPA for that repetition rate then the ABS offset is adjusted to make the actual DtMOPA for that repetition rate the same as the reference DtMOPA for that repetition rate.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

The invention claimed is:

1. Apparatus comprising:
a laser configured to operate at any one of a plurality of repetition rates;
a bandwidth controller configured to generate a control signal to at least partially control a bandwidth of the laser;
a correlator comprising electronically stored feedforward correlation data correlating a value of the control signal to each of the plurality of repetition rates; and
a module configured to determine at least one operating parameter of the laser and for supplying the determined operating parameter to the correlator as a feedforward value,
wherein the correlator is configured to generate an adjustment to the control signal based at least in part on the feedforward value.

2. Apparatus as claimed in claim 1 wherein the laser has a first chamber and a second chamber and wherein the control signal is a firing timing control signal DtMOPA that at least partially controls a timing of firing in the second chamber relative to a timing of firing in the first chamber.

3. Apparatus as claimed in claim 2 wherein the correlator is configured to generate an adjustment to DtMOPA.

4. Apparatus as claimed in claim 1 wherein the correlator is a feedforward lookup table storing correlation data correlating a value of the control signal to a repetition rate for at least some of the plurality of repetition rates.

5. Apparatus comprising:
a laser having a first chamber and a second chamber and configured to operate at any one of a plurality of repetition rates;
a bandwidth controller configured to generate a control signal to at least partially control a bandwidth of the laser, the control signal comprising a firing timing control signal DtMOPA that at least partially controls a timing of firing in the second chamber relative to a timing of firing in the first chamber;
a correlator comprising electronically stored feedforward correlation data correlating a value of the control signal to a repetition rate for each of the plurality of repetition rates; and
a module configured to determine at least one operating parameter of the laser and for supplying the determined operating parameter to the correlator as a feedforward value,
wherein the correlator is configured to generate an adjustment to the control signal based at least in part on the feedforward value the correlator is configured to generate an adjustment to DtMOPA according to the formula $$DtMOPA + \text{feedforward gain} * (FF(RR_{current}) - FF(RR_{previous}))$$

where
DtMOPA is an actual relative timing of firing in the first and second chamber, $FF(RR_{current})$ is a stored value of DtMOPA for a current repetition rate, $FF(RR_{previous})$ is a stored value of DtMOPA for a previous repetition rate, and
feedforward gain is a gain factor.

6. Apparatus comprising:
a laser having a first chamber and a second chamber and configured to operate at any one of a plurality of repetition rates;
a bandwidth controller configured to generate a control signal to at least partially control a bandwidth of the laser, the control signal comprising a firing timing control signal DtMOPA that at least partially controls a timing of firing in the second chamber relative to a timing of firing in the first chamber;

a correlator comprising electronically stored feedforward correlation data correlating a value of the control signal to a repetition rate for each of the plurality of repetition rates; and a module configured to determine at least one operating parameter of the laser and for supplying the determined operating parameter to the correlator as a feedforward value, wherein the at least one operating parameter is a moving average value of DtMOPA for the current repetition rate.

7. Apparatus comprising:

a laser configured to operate at any one of a plurality of repetition rates;

a bandwidth controller configured to generate a control signal to at least partially control a bandwidth of the laser;

a module configured to determine at least one operating parameter of the laser and for generating a signal indicative of the determined operating parameter as a feedforward value; and a correlator arranged to receive a signal indicative of a current repetition rate and the feedforward value and comprising electronically stored feedforward correlation data correlating a value of the control signal to each of the plurality of repetition rates, wherein the correlator is configured to generate an adjustment to the control signal based at least in part on the feedforward value.

8. Apparatus as claimed in claim 7 wherein the laser has a first chamber and a second chamber and wherein the control signal is a firing timing control signal DtMOPA that at least partially controls a timing of firing in the second chamber relative to a timing of firing in the first chamber.

9. Apparatus as claimed in claim 8 wherein the correlator is configured to generate an adjustment to DtMOPA.

10. Apparatus as claimed in claim 7 wherein the correlator is a feedforward lookup table storing correlation data correlating a value of the control signal to a repetition rate for at least some of the plurality of repetition rates.

* * * * *